(12) United States Patent
Takikawa et al.

(10) Patent No.: US 6,999,290 B1
(45) Date of Patent: Feb. 14, 2006

(54) INTEGRATED CIRCUIT WITH PROTECTION AGAINST ELECTROSTATIC DAMAGE

(75) Inventors: Kumiko Takikawa, Tama (JP); Satoshi Tanaka, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/959,466

(22) PCT Filed: Apr. 28, 1999

(86) PCT No.: PCT/JP99/02279

§ 371 (c)(1),
(2), (4) Date: Oct. 26, 2001

(87) PCT Pub. No.: WO00/67323

PCT Pub. Date: Nov. 9, 2000

(51) Int. Cl.
*H02H 9/00* (2006.01)

(52) U.S. Cl. ........................................ 361/56; 361/119
(58) Field of Classification Search ................ 361/56, 361/51, 91, 98, 100, 111, 54, 58, 101, 119; 307/100
See application file for complete search history.

(56) References Cited

U.S. PATENT DOCUMENTS

| | | | |
|---|---|---|---|
| 5,301,081 A * | 4/1994 | Podell et al. | 361/56 |
| 5,521,783 A * | 5/1996 | Wolfe et al. | 361/56 |
| 5,774,015 A * | 6/1998 | Murakami | 327/565 |
| 6,134,136 A * | 10/2000 | Ishii et al. | 365/51 |
| 6,278,162 B1 * | 8/2001 | Lien et al. | 257/408 |
| 6,445,039 B1 * | 9/2002 | Woo et al. | 257/355 |

FOREIGN PATENT DOCUMENTS

| | | |
|---|---|---|
| JP | 1-230266 | 9/1989 |
| JP | 5-299585 | 11/1993 |
| JP | 7-66370 | 3/1995 |
| JP | 7-202583 | 8/1995 |
| JP | 9-270492 | 10/1997 |
| JP | 10-32260 | 2/1998 |

\* cited by examiner

*Primary Examiner*—Donald Sparks
*Assistant Examiner*—Lawrence Luk
(74) *Attorney, Agent, or Firm*—Miles & Stockbridge P.C.

(57) ABSTRACT

An IC having inputs and outputs for a plurality of frequency bands from a high frequency band to a low frequency band is protected from electrostatic damage.

A high-frequency section of the IC is provided with a protection circuit including diode-connected transistors connected by multiple stages. In addition, there are applied the transistors in which elements thereof are isolated by insulator that can prevent thyristor operation.

13 Claims, 11 Drawing Sheets

US 6,999,290 B1

INTEGRATED CIRCUIT WITH PROTECTION AGAINST ELECTROSTATIC DAMAGE

TECHNICAL FIELD

The present invention relates primarily to a protection circuit for preventing electrostatic damage of semiconductor integrated circuits for processing signals from an intermediate frequency band to a high frequency band.

BACKGROUND ART

FIG. 7 is one example of semiconductor integrated circuits for transmission incorporated into a prior art handset for wireless mobile communications (hereinafter, referred to as a handset).

The semiconductor integrated circuits (hereinafter, IC) are produced discretely for each function. Each of the parts enclosed by a square is a discrete IC. The numeral 70 denotes a protection circuit against electrostatic discharge (hereinafter, referred to as a protection circuit) of the discrete ICs.

In the prior art construction, the protection circuits 70 are provided in an automatic gain-control amplifiers 73 and 76, a demodulator 74, and a modulator 75, which are intermediate frequency band ICs of several hundred MHz. The protection circuit 70 prevents circuit damage due to electrostatic charge from several tens of V to several hundreds of V. On the other hand, the protection circuits are not provided in a low-noise amplifier 71, a receiving mixer 72, a transmitting mixer 77, a pre-amplifier for transmission 78, and a high-power amplifier 79, which are high frequency band ICs in the vicinity of 1 GHz.

Japanese Published Unexamined Patent Application No. Hei 07-202583 discloses one example of a protection circuit. This is as shown in FIG. 8. The numeral 81 denotes a protection circuit. V denotes an input or output signal to/from an integrated circuit, which is inputted through a signal line 84 to an internal circuit 85 or is outputted therethrough from the internal circuit 85. The protection circuit 81 has diode-connected NMOS transistors 82 and 83. The gate and drain of the transistor 82 are short-circuited and are connected to the signal line 84. The source thereof is connected to power source Vcc. The drain of the transistor 83 is connected to the signal line 84, and the gate and source thereof are short-circuited and are connected to a ground. The top and bottom diagrams on the right side of FIG. 8 respectively show the static characteristics of the transistors 82 and 83 and the operation of a high-frequency signal. When positive static electricity V1 higher than voltage Von+power source voltage Vcc is applied to the signal line 84, forward current of diode I is then flowed to the transistor 82 so as to protect the internal circuit 85. When high static voltage V2 is applied, a breakdown current is flowed to the transistor 83.

Upon application of static voltage V3' below −Von to the signal line 84, forward current of diode I' is flowed to the transistor 83. Further, upon application of negative high static voltage V4' is applied, a breakdown current is flowed to the transistor 82.

Japanese Published Unexamined Patent Application No. Hei 01-230266 discloses one example of a protection circuit constructed by diodes connected by multiple stages. FIGS. 9 and 10 respectively illustrate a circuit diagram thereof and a cross section of a diode construction. Diodes 91 and 92 are protection circuits. A signal is transmitted to a circuit 94 by a signal line 93. A protection circuit between the power source line and the signal line 93 is omitted. Since the diodes are connected by two stages, the Von voltage is high. FIG. 10 shows the cross-sectional construction of the protection circuit in which the diodes are connected by two stages. The numeral 101 denotes a P type substrate forming an integrated circuit. The numeral 102 denotes an N type epitaxial layer. A P type diffusion layer 103 and an N type diffusion layer 104 form a PN junction diode. A P type isolation diffusion layer 105 is a channel stopper.

The numeral 106 denotes a silicon dioxide film 106. A cathode electrode 107 is grounded to a signal line 109 of the internal circuit, and an anode electrode 108 is grounded outside the integrated circuit.

DISCLOSURE OF INVENTION

There is desired a one-chip IC integrating the modulator and demodulator circuits for a transmit/receive band to high-frequency amplification corresponding to the numerals 71, 72, 73, 74, 75, 76, 77 and 78 shown in FIG. 7. In the radio-frequency circuits 71, 72, 77 and 78, matching circuits including capacitance and inductor is used for input-output circuits. The effect of impedance conversion of the matching circuit amplifies the signal voltage amplitude in the input-output section of the integrated circuit. Since the output terminal of each of the circuits has a power source voltage direct-current potential, a signal above the power source potential is outputted. The voltage threshold value of the protection circuit 70 is set so as to protect, for example, the amplifier 73. Since these radio-frequency circuits are on a chip identical to the amplifier 73, an electric current is flowed to the protection circuit, thereby distorting the signal. In the prior art protection circuit, the parasitic capacitance is high for these radio-frequency circuits, resulting in gain loss.

This problem will be described in detail with FIG. 8. The circuit output for linearity loss will be described first.

The above-mentioned radio-frequency circuit is connected outside of an IC by an open collector so that an output is of large amplitude. For this reason, a matching method using capacitance and inductor is applied. A power source voltage is applied to the IC output terminal.

In FIG. 8, the internal circuit 85 corresponds to a low-noise amplifier 52, or a receiving mixer 53 and a transmitting mixer 56, or a pre-amplifier for transmission 57 of FIG. 5. Power source voltage Vcc is applied to the signal line 84, and then, a high-frequency signal is superimposed onto the Vcc. A high-frequency voltage 86 is applied to the transistor 82 centered on the origin point of the right-side graph of FIG. 8. The signal part exceeding the Von is distorted by a non-linear high-frequency current 87 flowing to the transistor 82.

In the receiving circuit, when the interference wave of a vicinity band unremovable by a filter in the previous stage of the circuit of interference waves included in an input signal is of voltage amplitude above the Von, the interference wave causes distortion to degrade the S/N characteristic in the receiving band. In the transmitting circuit, an output signal is of large output amplitude to also degrade the S/N.

This problem can be released by the protection circuits of FIG. 9. However, in the case of a one-chip IC, the radio-frequency circuit and the intermediate-frequency circuit are uniformly provided with a multi-stage transistor circuit as shown in FIG. 9, resulting in increase of the chip area. The P type diffusion layer as the channel stopper is inserted so that the part indicated by the numeral 100 of FIG. 10 is of a thyristor construction. FIG. 11 shows the operating principle of the thyristor. When the thyristor is in a state of forward voltage, and the voltage is low, an electric current hardly flows. When the voltage is high, the protection circuit is turned on to flow a large electric current. The protection circuit of FIG. 9 can be turned on by the large voltage of the static electricity.

To solve the foregoing problems, the intermediate-frequency band circuit of the IC is provided with the prior art protection circuit having transistors diode-connected by 1 stage to the power source or the ground, respectively, as shown in FIG. 8. The high-frequency section of the IC is provided with a protection circuit having transistors diode-connected by multiple stages. Further, the protection circuit having transistors connected by multiple stages is such that elements thereof are isolated by insulator capable of protecting the behavior as a thyristor.

BEST MODE FOR CARRYING OUT THE INVENTION

Figure 1:
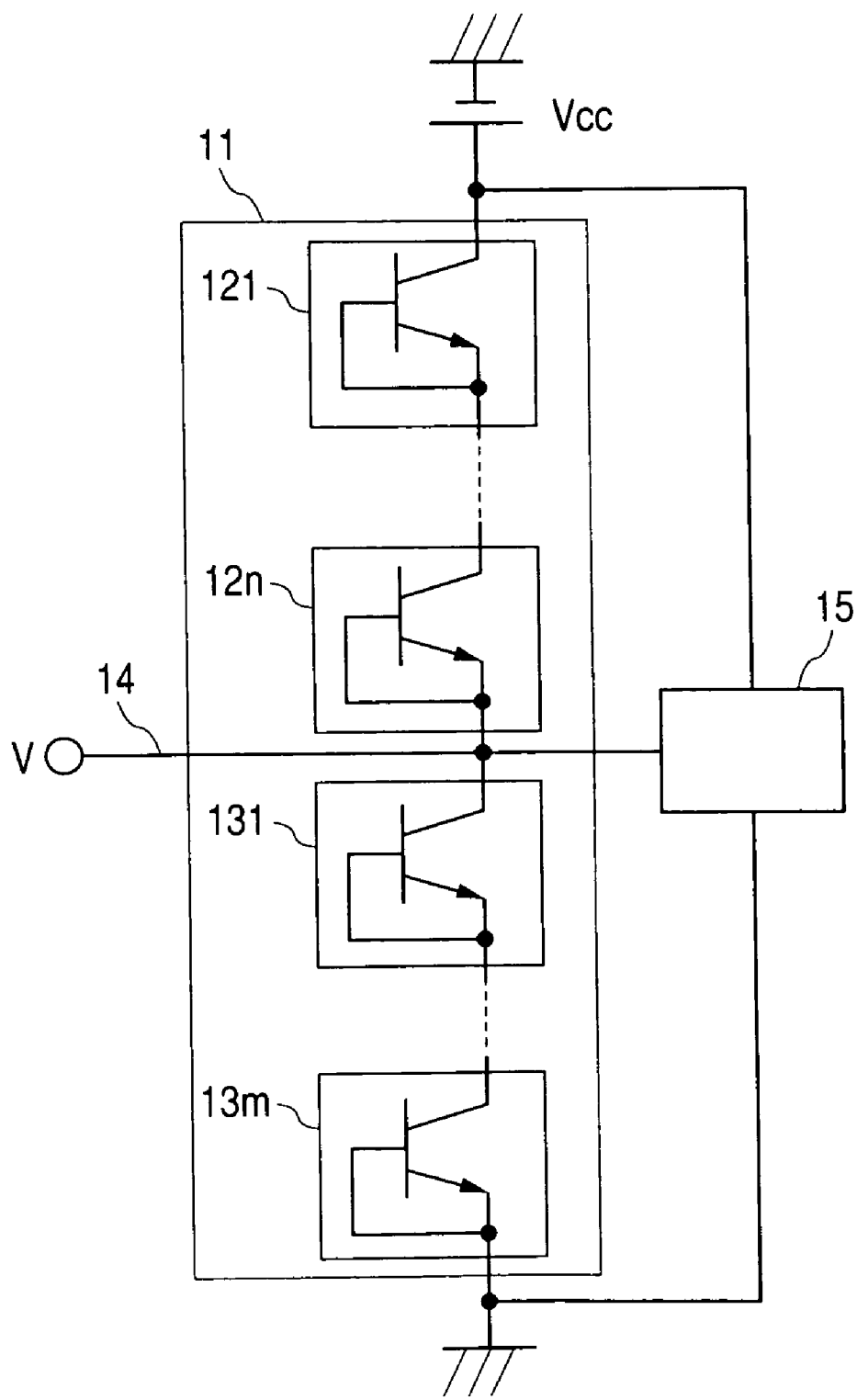
FIG. 1 is a diagram showing one embodiment of a protection circuit applied to the present invention.

Preferred embodiments of the present invention will be described hereinbelow with the drawings. The numerals of the drawings are as follows.

11 . . . Protection circuit
12₁, 12n, 13₁, 13m . . . Bipolar transistor isolated electrically and diode-connected
14 . . . Signal line
15 . . . Internal circuit
21 . . . One example of the protection circuit construction of the present invention
22a, 22b, 22c, 22d . . . Bipolar transistor in the protection circuit isolated electrically and diode-connected
23 . . . Transistor of an amplifier
24 . . . Collector terminal of the transistor of the amplifier
25 . . . Input matching circuit
26 . . . Output matching circuit
42₁, 42n, 43₁, 43m . . . MOSFET isolated electrically and diode-connected
50a . . . Protection circuit for a high-frequency section circuit
50b . . . Protection circuit for an intermediate frequency band circuit
51 . . . IC circuit including a high-frequency section and an intermediate-frequency band.
52 . . . Low-noise amplifier
53 . . . Receiving mixer
54 . . . Demodulator
55 . . . Modulator
56 . . . Transmitting mixer
57 . . . Pre-amplifier for transmission
58a, 58b, 58c . . . Filter
60a, 60b . . . Protection circuit
61a . . . SOI substrate
61b . . . . Silicon dioxide layer
62 . . . Trench
63 . . . N type epitaxial layer
64 . . . P type diffusion layer
65 . . . n type diffusion layer
66 . . . Silicon dioxide layer
67a . . . Collector electrode
67b . . . Base electrode
67c . . . Emitter electrode
68 . . . Wiring
70 . . . Protection circuit
71 . . . Low-noise amplifier
72 . . . Receiving mixer
73, 76 . . . Automatic gain-control amplifier
74 . . . Demodulator
75 . . . Modulator
77 . . . Transmitting mixer
78 . . . Pre-amplifier for transmission
79 . . . High-power amplifier
81 . . . Protection circuit
82, 83 . . . Diode-connected MOSFET
84 . . . Signal line
85 . . . Internal circuit
86, 88 . . . High-frequency voltage
87, 89 . . . High-frequency current
91, 92 . . . Protection circuit
93 . . . Signal line
94 . . . Protection circuit
100 . . . Thyristor connection
101 . . . P type substrate
102 . . . N type epitaxial layer
103 . . . P type diffusion layer
104 . . . N type diffusion layer
105 . . . P type isolation diffusion layer
106 . . . Silicon dioxide film
107 . . . Cathode electrode
108 . . . Anode electrode
109 . . . Signal line FIGS. 1 to 6 show the embodiments of the present invention.

Figure 5:
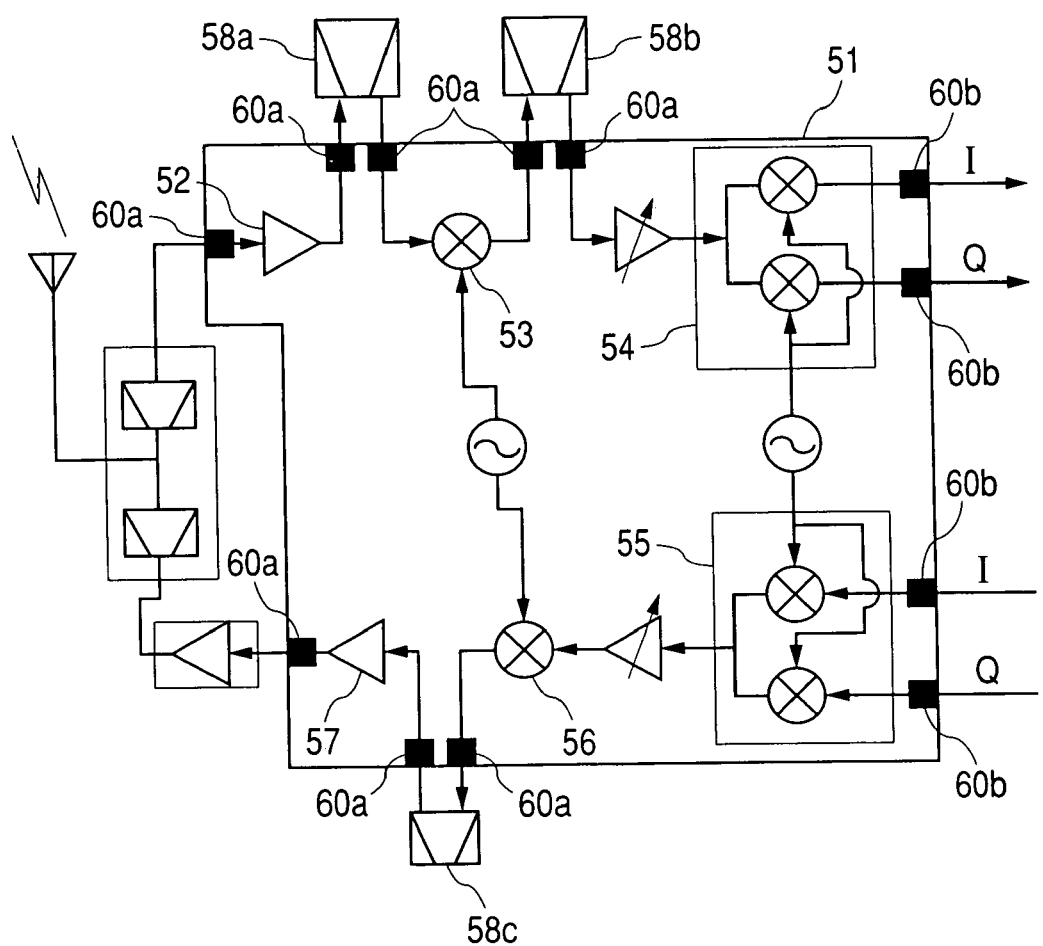
FIG. 5 is a diagram showing semiconductor integrated circuits for transmission incorporated into a handset provided with the protection circuits.

FIG. 5 is one construction example of protection circuits of the present invention. The numeral 51 denotes an IC applying the present invention. The power source voltage of the IC is about 3V. Each of protection circuits 60b has transistors diode-connected by 1 stage. The protection circuits 60b are provided in the power source line and the ground line of a demodulator 54 and a modulator 55, which are intermediate frequency band circuits. Each of protection circuits 60a has transistors diode-connected by multiple stages. The protection circuits 60a are provided in the input and output of a low-noise amplifier 52, a receiving mixer 53, a transmitting mixer 56, and a pre-amplifier for transmission 57, which are high-frequency section circuits. The transistors are isolated discretely and electrically in order to avoid the behavior as a thyristor as described above. In the protection circuits 60a and 60b, the number of connection stages is different. The breakdown voltage to static electricity are different. The parasitic capacitances are also different.

Figure 6:
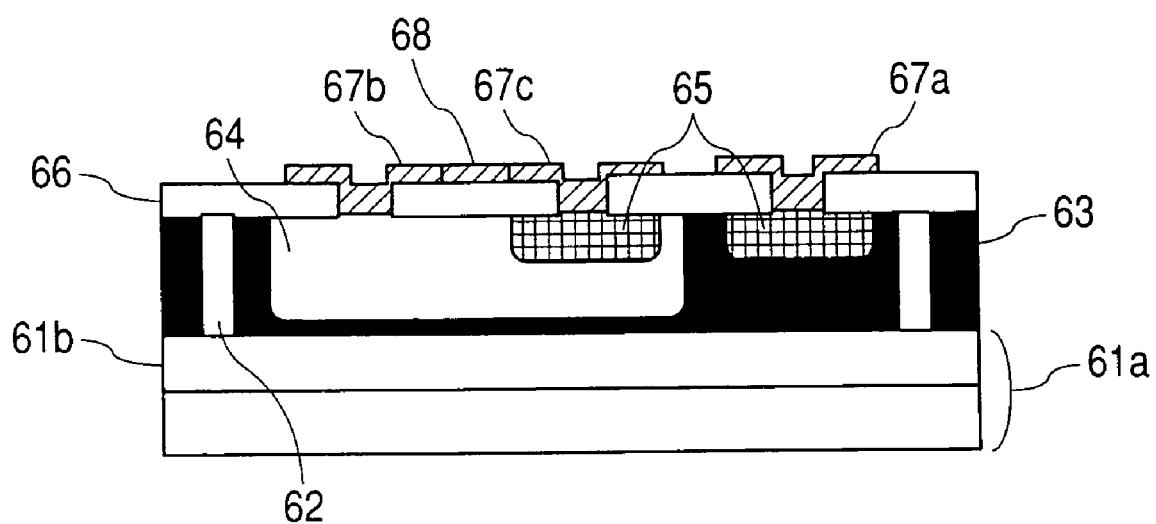
FIG. 6 is a diagram showing a transistor construction of the protection circuit applying the present invention.
Figure 7:
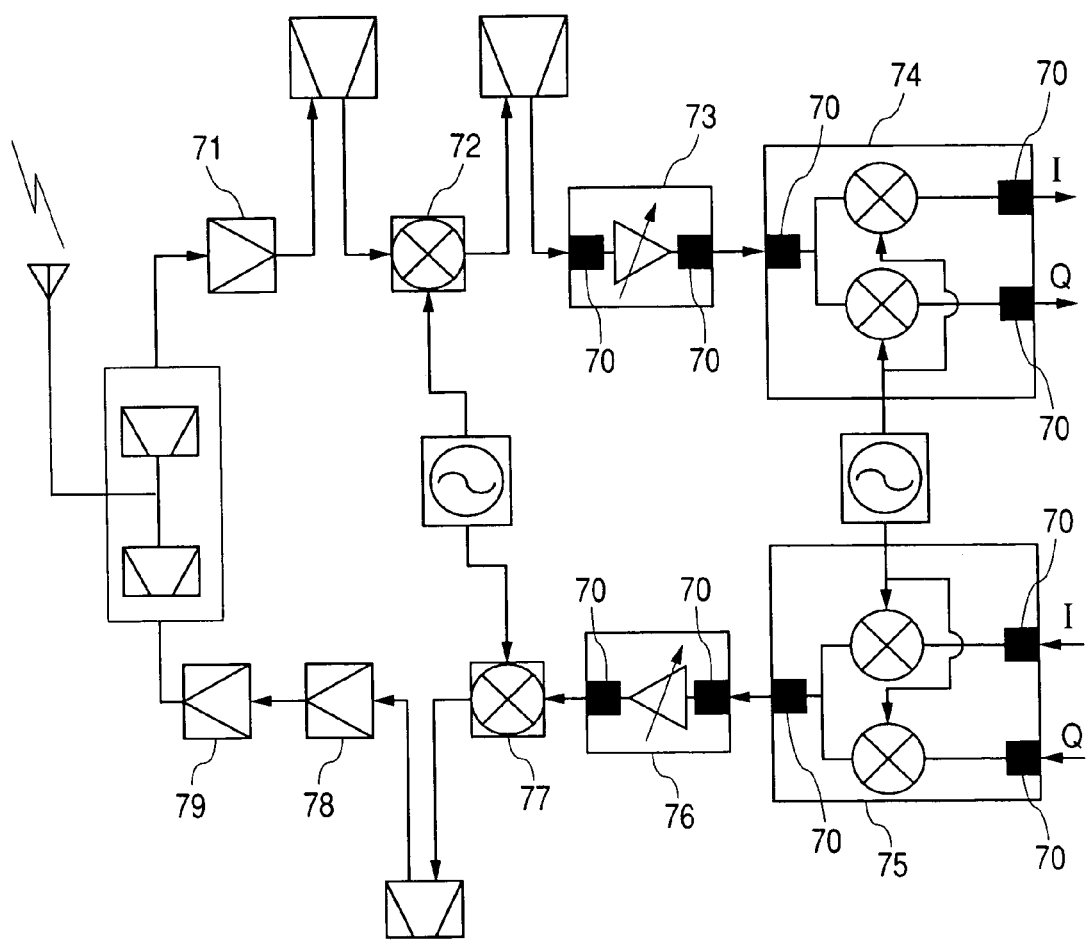
FIG. 7 is a diagram showing prior art semiconductor integrated circuits for transmission incorporated into a handset for wireless mobile communications.
Figure 8:
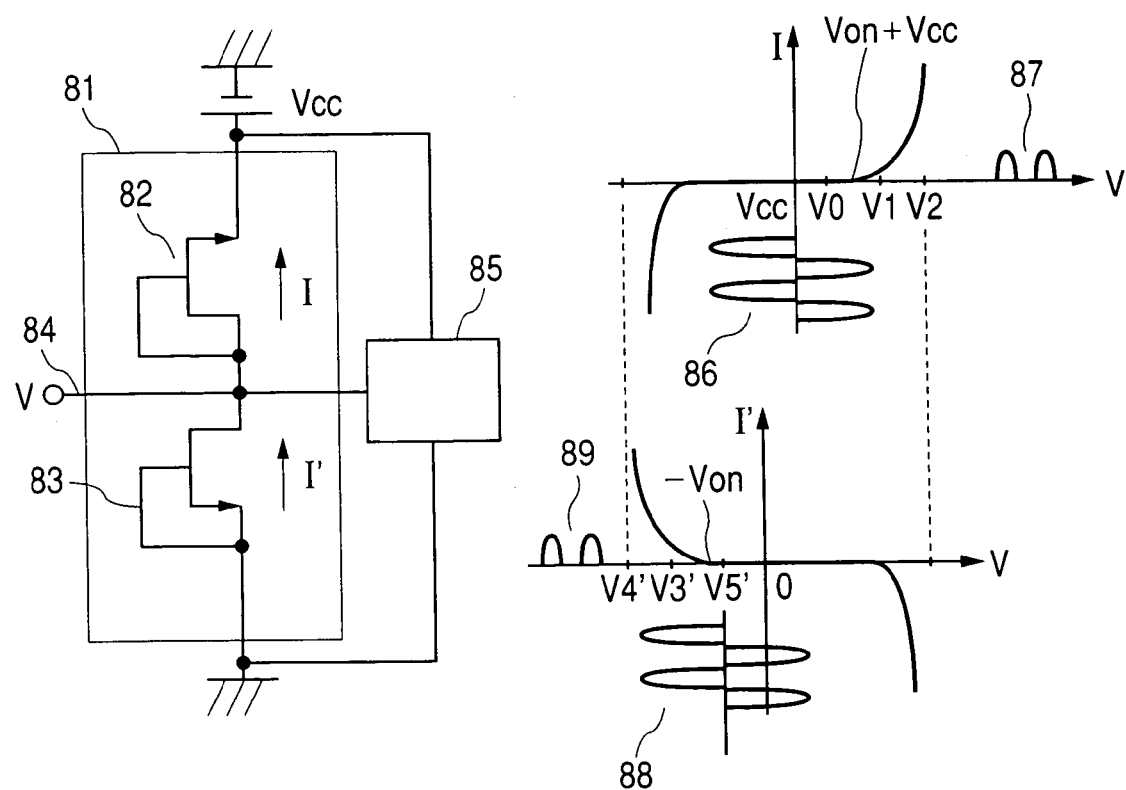
FIG. 8 is a diagram showing a first example of a prior art protection circuit.
Figure 9:
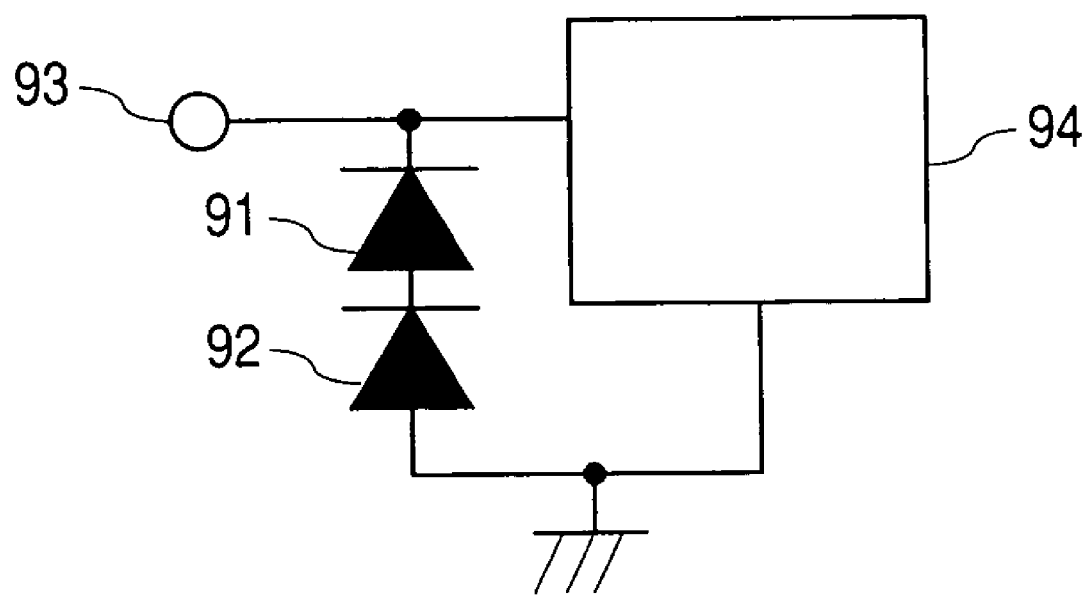
FIG. 9 is a diagram showing a second example of the prior art protection circuit.
Figure 10:
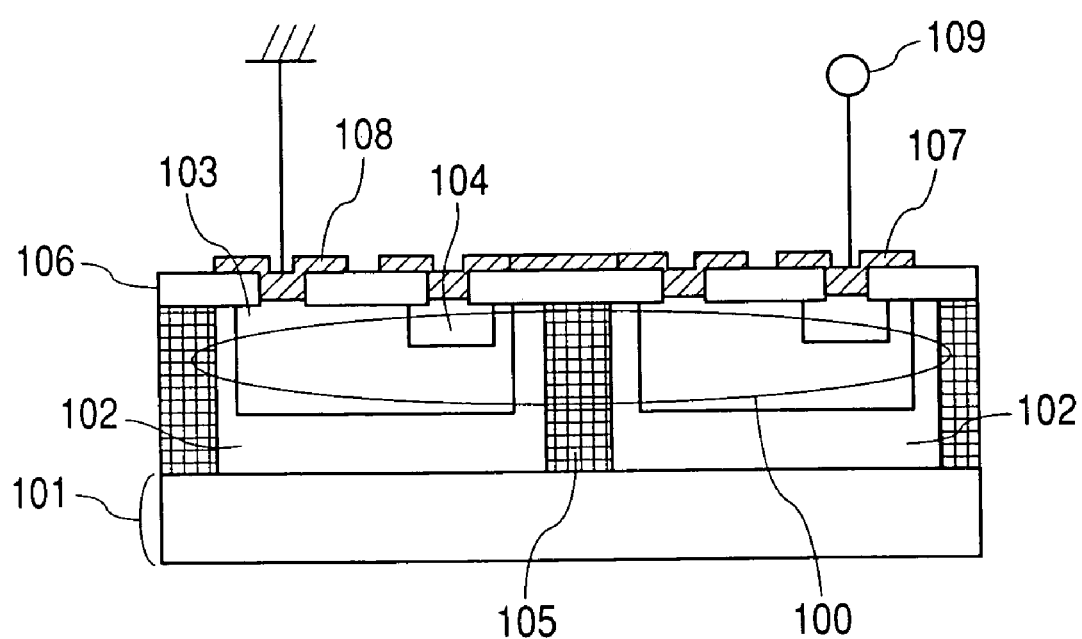
FIG. 10 is a diagram showing a transistor construction for use in the prior art protection circuit.
Figure 11:
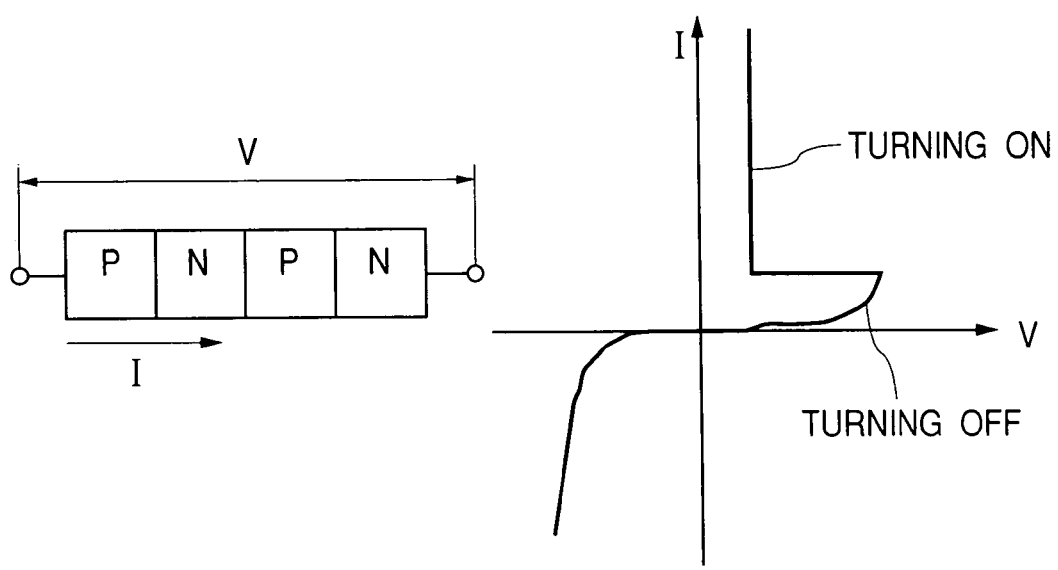
FIG. 11 is a diagram showing the construction and operating principle of a thyristor.

FIG. 6 shows a transistor construction of one embodiment of the present invention. The numeral 61a denotes an SOI (Silicon on Insulator) substrate produced by laminating insulator such as a silicon dioxide layer 61b onto the silicon. A silicon dioxide 62 is filled in to a trench formed by dry etching the substrate by a CVD (Chemical Vapor Deposition) method. After an N type epitaxial layer 63 is formed on the SOI substrate, an N type diffusion layer 64 and a P type diffusion layer 65 are formed to construct a base, emitter, and collector. A silicon dioxide layer 66 is laminated on the top thereof so as to provide a collector electrode 67a, a base electrode 67b, and an emitter electrode 67c. In this manner, a transistor isolated discretely and electrically is formed using the silicon dioxide layer 61b and the trench 62 as a barrier. The base electrode 67b and the emitter electrode 67c of the transistor are connected by a wiring 68 so as to provide a diode construction, thereby constructing a protection circuit having the transistors connected in series by multiple stages. With the bipolar transistor as the example, when a MOSFET is used, a substrate and a trench are formed in the same manner. This transistor construction can be applied to the entire IC circuit.

FIG. 1 is one embodiment of a protection circuit in which the present invention is applied to the high-frequency section circuit. The numeral 11 denotes a protection circuit of the present invention. V is an input or output signal to/from the integrated circuit. The signal is inputted through a signal line 14 to an internal circuit 15 or is outputted from the internal circuit 15. The protection circuit 11 has diode-connected bipolar transistors 121 to 12n and 131 to 13n. These bipolar transistors are electrically isolated from each other, as shown in FIG. 6. The base and emitter of the bipolar transistor 121 are short-circuited, and the collector thereof is connected the power source. The collectors of the n bipolar transistors 12n whose base and emitter are short-circuited are sequentially connected in series with the upper-stage emitter. The emitter of the nth transistor is connected to the signal line 14. The collector of the bipolar transistor 131 is connected to the signal line 14, and the base and emitter thereof are short-circuited. Likewise, the collectors of the bipolar transistors whose base and emitter are short-circuited are sequentially connected in series with the upper-stage emitter, and finally, the emitter of the mth transistor is connected to the ground. Thus, the Von is increased, and the –Von is decreased.

Figure 2:
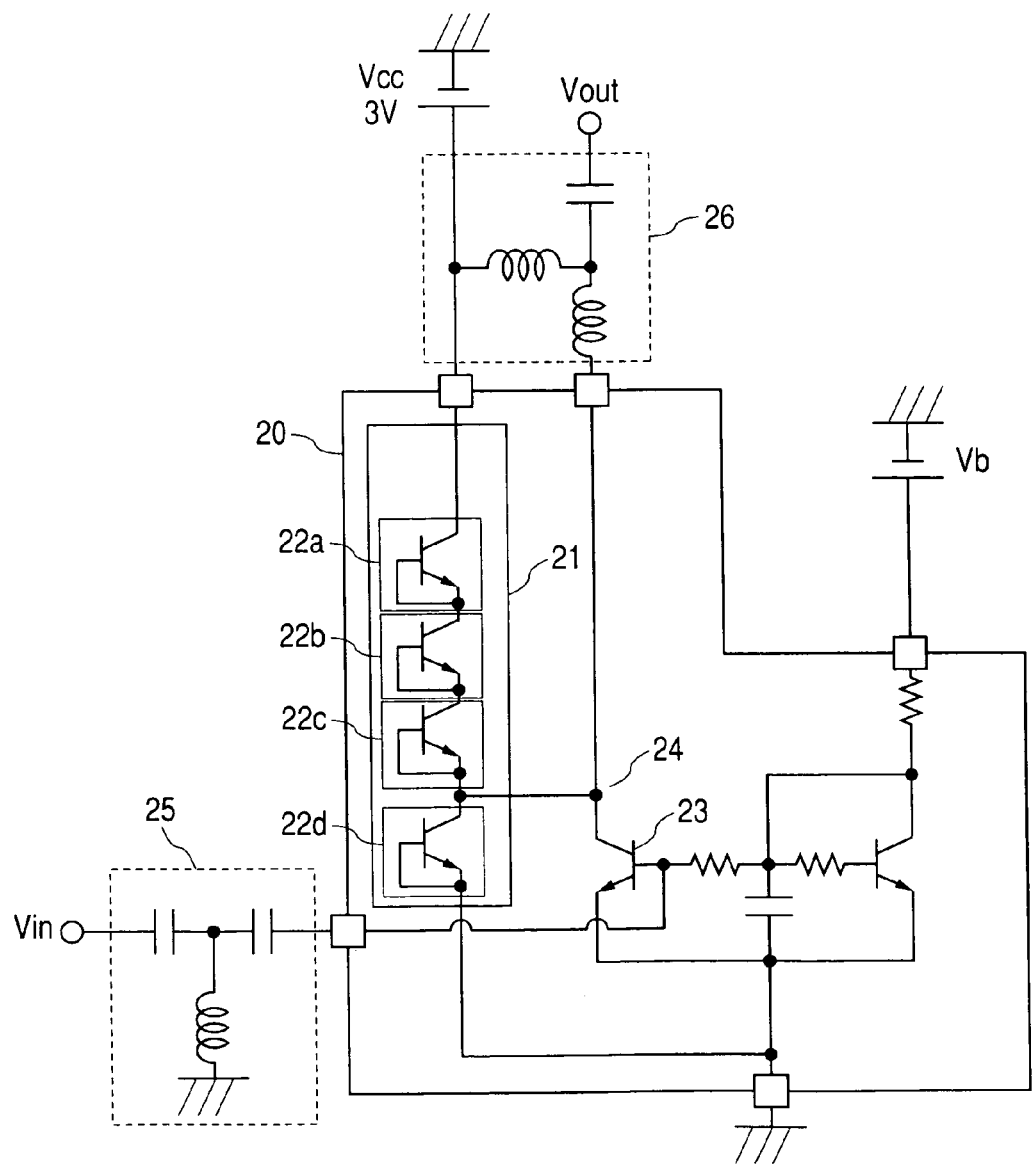
FIG. 2 is a diagram showing one example of an amplifier applying the present invention.
Figure 3:
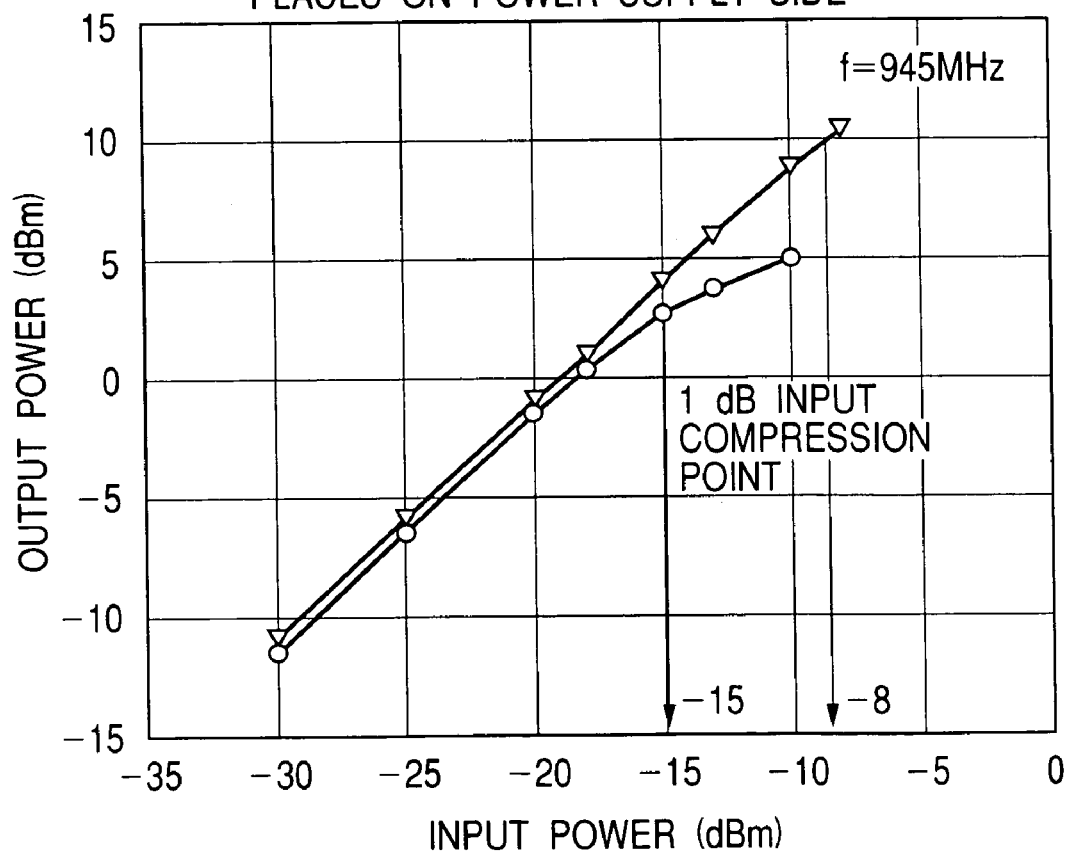
FIG. 3 is a diagram showing the characteristic of the amplifier with the protection circuit applying the present invention.

FIG. 2 is an example in which an amplifier is applied to the internal circuit 15. The numeral 20 is an IC including a protection circuit 21. Circuits 25 and 26 outside the IC are an input matching circuit and an output matching circuit, respectively. The amplifier is a current mirror type amplifier. Vb is a constant voltage. A high-frequency input voltage Vin is amplified by a transistor 23 and is then outputted from Vout. Transistors 22a to 22d constructing the protection circuit 21 is of a construction shown in FIG. 6. 3V which is the same as the power source voltage is applied through the inductor of the output matching circuit 26 to a collector 24 of the transistor 23. A voltage capable of satisfying the dynamic range of the amplifier is 4V. For this reason, the transistors of the protection circuit are connected in series by 3 stages. Since this amplifier does not use a negative power source, the transistors are connected to the ground side by 1 stage. The transistor 22d protects the circuit when low and negative static electricity is applied. FIG. 3 shows the input-output characteristics of the circuit of FIG. 2. When connection of the transistors in series by 1 stage is changed to connection of the transistors in series by 3 stages, the 1 dB input compression point is changed from –15 dBm to –8 dBm, thereby improving the linearity. Further, in the capacitance between the collector and the emitter of each of the transistors connected in series, the parasitic capacitance of the protection circuit is decreased as compared with the prior art protection circuit consisting of transistors diode-connected by 1 stage to the power source or the ground, therefore the gain loss of the amplifier is small. The adjacent transistors are isolated by the silicon dioxide layer as insulator and do not perform thyristor operation. Since the frequency of the intermediate frequency band circuit is low, the characteristic degradation due to the parasitic capacitance is extremely small. The prior art protection circuit may be applied.

The example of the output point of the enhancement type transistor is given above.

As in GaAsFET, a depression type transistor will be considered. When –Von of the transistor connected to the ground side is higher than the voltage applied to the gate of the transistor, a non-linear electric current is superimposed onto an input signal to be amplified. For this reason, the linearity is lost. To decrease –Von, the protection circuit in which the transistors connected to the ground side are connected in series must be provided on the input side. As described above, the number of the transistors connected in series is determined by the operating point of the internal circuit or the 1 dB input compression point target value.

Figure 4:
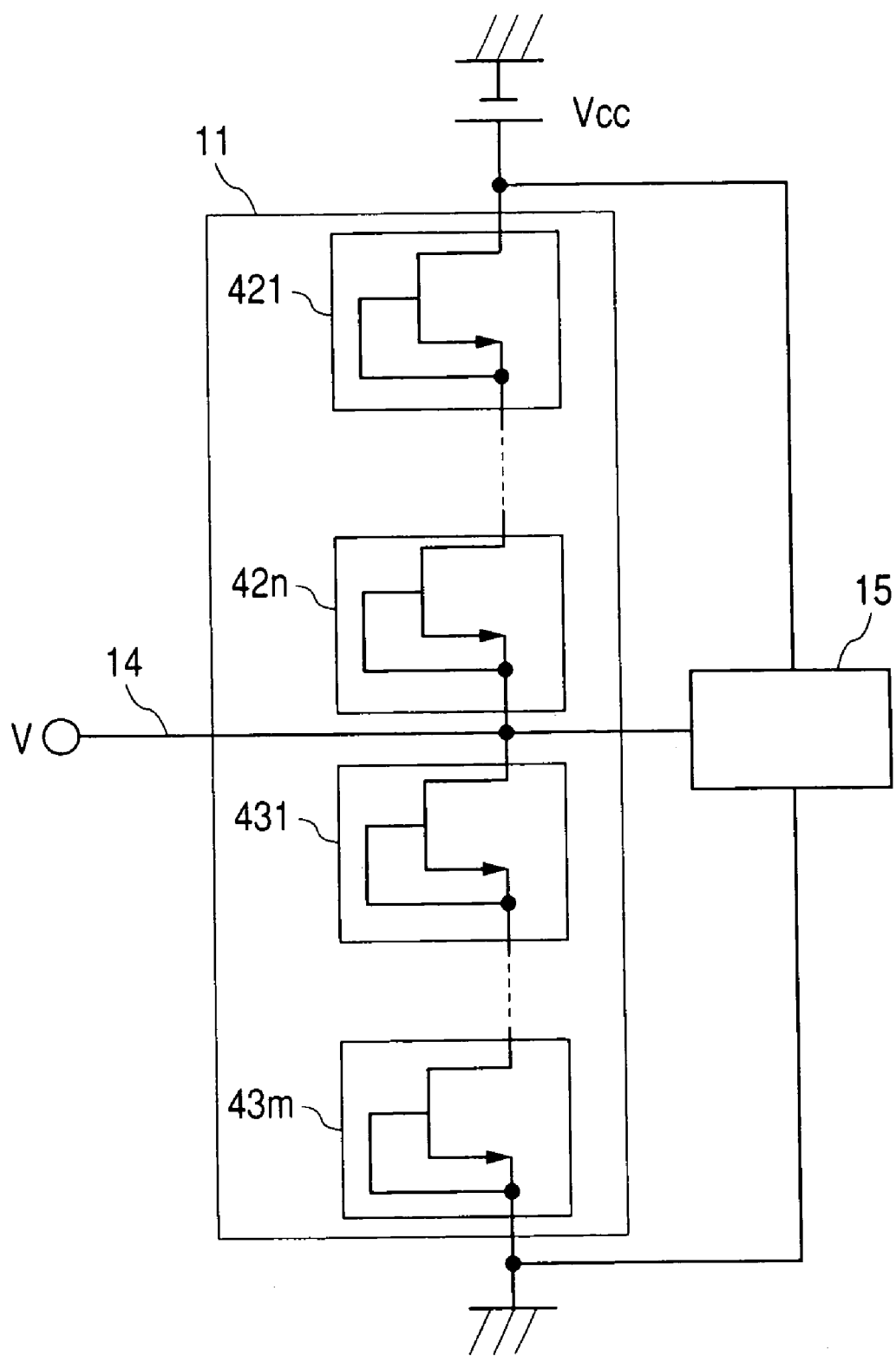
FIG. 4 is a diagram showing another embodiment of the protection circuit applied to the present invention.

FIG. 4 shows another embodiment of the protection circuit applied to the present invention. The protection circuit is constructed by MOSFETs. As in the bipolar transistors, there are used n diode-connected MOSFETs of 421 to 42n and m diode-connected MOSFETs of 431 to 43m. As in the bipolar transistors shown in FIG. 6, the MOSFETs are isolated electrically. This embodiment can be applied when an integrated circuit is constructed by MOSFETs.

As described above, in the one-chip IC integrating the high-frequency section and the intermediate frequency band, aside from the prior art protection circuit consisting of transistors diode-connected by 1 stage applied to the intermediate frequency band, the protection circuit consisting of transistors connected in series by multiple stages is provided in the high-frequency section circuit. Therefore, the parasitic capacitance is decreased, and the Von is increased so as to prevent the gain and linearity from being lost. Further, as two kinds of protection circuits having different constructions are provided in each of the circuits in the one-chip IC, the total area of the protection circuit can be small in the chip as compared with the case that the protection circuit consisting of transistors connected by multiple stages is applied to all the circuits in the IC.

Thus, high breakdown voltage to static electricity of the entire IC can be realized.

What is claimed is:

1. A semiconductor integrated circuit having different circuits operative at different frequencies, respectively, and having a plurality of input and output terminals for said circuits, comprising at least two or more kinds of protection circuits against electrostatic discharge having different electrical characteristics corresponding to the different circuits.

2. The semiconductor integrated circuit according to claim 1, wherein the protection circuits against electrostatic discharge have different breakdown voltage.

3. A semiconductor integrated circuit according to claim 1, wherein the different circuits include a high-frequency section and a lower-frequency section, and wherein the sections have protection circuits against electrostatic discharge that have different electrical characteristics.

4. A semiconductor integrated circuit according to claim 3, wherein the protection circuit of the high-frequency section is constructed by diodes connected in series and reversely biased between a power source terminal and a ground terminal.

5. A semiconductor integrated circuit according to claim 4, wherein the diodes are diode-connected bipolar transistors.

6. A semiconductor integrated circuit according to claim 3, wherein the semiconductor integrated circuit is a one-chip integrated circuit integrating the high-frequency section and the lower-frequency section, the protection circuit of the lower-frequency section comprises one stage of diode-connected transistors, and the protection circuit of the high-frequency section comprises diode-connected transistors connected in series by multiple stages.

7. A semiconductor integrated circuit having a plurality of input and output terminals, comprising at least two or more kinds of protection circuits against electrostatic discharge having different electrical characteristics, wherein the protection circuits against electrostatic discharge have different parasitic capacitances viewed from the input and output terminals.

8. The semiconductor integrated circuit according to claim 7, including a first protection circuit against electrostatic discharge having diode-connected transistors by 1 stage and a second protection circuit against electrostatic discharge having diode-connected transistors connected in series by multiple stages, the second protection circuit against electrostatic discharge being provided in the output of a circuit of an output signal exceeding the power source voltage.

9. The semiconductor integrated circuit according to claim 7, including a circuit operating when an input potential exceeds a negative ON voltage, and a protection circuit against electrostatic discharge provided in the input of the circuit consisting of diode-connected transistors isolated electrically by the barrier of an insulator which are connected in series by multiple stages.

10. The semiconductor integrated circuit according to claim 7, further comprising including a first protection circuit against electrostatic discharge having diode-connected transistors by 1 stage and a second protection circuit against electrostatic discharge having diode-connected transistors connected in series by multiple stages, the second protection circuit against electrostatic discharge being provided in the output of a circuit of an output signal exceeding the power source voltage.

11. The semiconductor integrated circuit according to claim 7, including a circuit operating when an input potential exceeds a negative ON voltage, and a protection circuit against electrostatic discharge provided in the input of the circuit consisting of diode-connected transistors isolated electrically by the barrier of an insulator which are connected in series by multiple stages.

12. A semiconductor integrated circuit comprising, in one chip, an intermediate-frequency circuit, a first protection circuit against electrostatic discharge having diode-connected transistors by 1 stage between the output of the intermediate-frequency circuit and the power source or the ground, a high-frequency circuit, and a second protection circuit against electrostatic discharge having diode-connected transistors connected in series by multiple stages between the input of the high-frequency circuit and at least one of the power source and the ground.

13. The semiconductor integrated circuit according to claim 12, wherein said transistors connected in series by multiple stages are discretely and electrically isolated by the barrier of an insulator.

* * * * *

UNITED STATES PATENT AND TRADEMARK OFFICE
CERTIFICATE OF CORRECTION

PATENT NO. : 6,999,290 B1
APPLICATION NO. : 09/959466
DATED : February 14, 2006
INVENTOR(S) : Kumiko Takikawa and Satoshi Tanaka It is certified that error appears in the above-identified patent and that said Letters Patent is hereby corrected as shown below:

On the Title Page

In item (73), the Assignee information should read as follows:

(73) Assignee: Renesas Technology Corp., Tokyo (JP)

Signed and Sealed this

Thirteenth Day of May, 2008

JON W. DUDAS
*Director of the United States Patent and Trademark Office*